(12) United States Patent
Kuo et al.

(10) Patent No.: US 11,656,128 B2
(45) Date of Patent: May 23, 2023

(54) MICROELECTROMECHANICAL INFRARED SENSING DEVICE AND FABRICATION METHOD THEREOF

(71) Applicant: INDUSTRIAL TECHNOLOGY RESEARCH INSTITUTE, Hsinchu (TW)

(72) Inventors: Chin-Jou Kuo, Tainan (TW); Bor-Shiun Lee, New Taipei (TW); Ming-Fa Chen, Taoyuan (TW)

(73) Assignee: INDUSTRIAL TECHNOLOGY RESEARCH INSTITUTE, Hsinchu (TW)

(*) Notice: Subject to any disclaimer, the term of this patent is extended or adjusted under 35 U.S.C. 154(b) by 0 days.

(21) Appl. No.: 17/729,884

(22) Filed: Apr. 26, 2022

(65) Prior Publication Data

US 2023/0040320 A1    Feb. 9, 2023

Related U.S. Application Data

(60) Provisional application No. 63/230,471, filed on Aug. 6, 2021.

(30) Foreign Application Priority Data

Jan. 19, 2022   (TW) ................................ 111102112

(51) Int. Cl.
*G01J 5/20*    (2006.01)
*B81B 3/00*    (2006.01)
*B81C 1/00*    (2006.01)

(52) U.S. Cl.
CPC .............. *G01J 5/20* (2013.01); *B81B 3/0072* (2013.01); *B81C 1/00666* (2013.01);
(Continued)

(58) Field of Classification Search
CPC ................................... G01J 5/20; G01J 5/024
See application file for complete search history.

(56) References Cited

U.S. PATENT DOCUMENTS 5,962,854 A    10/1999 Endo
9,029,783 B2    5/2015 Cannata et al.
(Continued)

FOREIGN PATENT DOCUMENTS

CN        101881667        11/2010
CN        102393252        3/2012
(Continued)

OTHER PUBLICATIONS

Taiwan Office Action dated Dec. 27, 2022 as received in application No. 111102112.

*Primary Examiner* — David P Porta
*Assistant Examiner* — Meenakshi S Sahu
(74) *Attorney, Agent, or Firm* — Maschoff Brennan

(57) ABSTRACT

A MEMS infrared sensing device includes a substrate and an infrared sensing element. The infrared sensing element is provided above the substrate and has a sensing area and an infrared absorbing area which do not overlap each other. The infrared sensing element includes two infrared absorbing structures, an infrared sensing layer provided between the two infrared absorbing structures, and an interdigitated electrode structure located in the sensing area. Each of the two infrared absorbing structures includes at least one infrared absorbing layer, and the two infrared absorbing structures are located in the sensing area and the infrared absorbing area. The infrared sensing layer is located in the sensing area and does not extend into the infrared absorbing area. The interdigitated electrode structure is in electrical contact with the infrared sensing layer.

21 Claims, 15 Drawing Sheets

(52) U.S. Cl.
CPC ... *B81B 2201/0278* (2013.01); *B81B 2203/04* (2013.01); *B81C 2201/0104* (2013.01); *B81C 2201/0107* (2013.01)

(56) References Cited

U.S. PATENT DOCUMENTS

| | | | |
|---|---|---|---|
| 9,417,134 B2 | 8/2016 | Koechlin et al. | |
| 10,234,332 B2* | 3/2019 | Roehrer | G01J 5/02 |
| 2009/0050808 A1 | 2/2009 | Ushimi | |
| 2017/0082497 A1 | 3/2017 | Cannata et al. | |
| 2023/0045432 A1* | 2/2023 | Kuo | B81C 1/00476 |

FOREIGN PATENT DOCUMENTS

| | | |
|---|---|---|
| CN | 102564601 | 7/2012 |
| CN | 106124066 | 11/2016 |
| CN | 111916513 | 11/2020 |
| TW | 201013942 A | 4/2010 |
| TW | 201728882 | 8/2017 |

\* cited by examiner

MICROELECTROMECHANICAL INFRARED SENSING DEVICE AND FABRICATION METHOD THEREOF

CROSS-REFERENCE TO RELATED APPLICATIONS

This application claims priority under 35 U.S.C. § 119(a) on Patent Application No(s). 63/230,471 filed in U.S. on Aug. 6, 2021, and Patent Application No(s). 111102112 filed in Taiwan, R.O.C. on Jan. 19, 2022, the entire contents of which are hereby incorporated by reference.

BACKGROUND

1. Technical Field

This disclosure relates to a microelectromechanical (MEMS) infrared sensing device and a fabrication method of the same.

2. Related Art

In recent years, MEMS infrared sensors have been widely applied in various fields. The demand for MEMS infrared sensors will increase significantly in many fields in the future, such as industrial production, environmental monitoring, home care and temperature measurement. In general, a MEMS infrared sensor mainly includes an infrared absorbing layer and an infrared sensing layer. The infrared absorbing layer absorbs infrared radiation and converts the radiation energy into heat. Heat generated by the absorption of infrared radiation may cause a rise of the temperature of the infrared sensing layer, and such temperature change may lead to a change in electrical resistance of the infrared sensing layer. The change in electrical resistance can be then converted into a change in voltage or current, so that the temperature of an object to be measured by the MEMS infrared sensor.

However, the material used in the infrared sensor has the disadvantages of high electrical resistance, which results in high overall electrical resistance large noise equivalent temperature difference (NETD), and said disadvantages not only reduce performance due to circuit burden but also influence thermal sensitivity of the infrared sensor. On the other hand, a photoelectric conversion efficiency of the infrared sensor can be evaluated by a fill factor thereof, and the fill factor is positively correlated with a ratio of an effective infrared absorbing area to a total area on the infrared sensor. Thus, the amount of the effective infrared absorbing area is an essential factor for improving the photoelectric conversion efficiency of the infrared sensor.

Furthermore, a suspension structure is formed above a reflective layer in a conventional MEMS infrared sensor. Since the suspension structure is suspended above the reflective layer, warpages of the suspension structure due to uneven stress distribution easily occur to cause inconsistent distance between the suspension structure and the reflective layer, and even poor thermal insulation due to directly physical contact between the suspension structure and the reflective layer. The warpages of the suspension structure may lead to not only a deterioration of infrared sensing performance but also a risk of completely functional failure.

SUMMARY

According to one embodiment of the disclosure, a MEMS infrared sensing device includes a substrate and an infrared sensing element. The infrared sensing element is provided above the substrate and has a sensing area and an infrared absorbing area which do not overlap each other. The infrared sensing element includes two infrared absorbing structures, an infrared sensing layer provided between the two infrared absorbing structures, and an interdigitated electrode structure located in the sensing area. Each of the two infrared absorbing structures includes at least one infrared absorbing layer, and the two infrared absorbing structures are located in the sensing area and the infrared absorbing area. The infrared sensing layer is located in the sensing area and does not extend into the infrared absorbing area. The interdigitated electrode structure is in electrical contact with the infrared sensing layer.

According to another embodiment of the disclosure, a method for fabricating MEMS infrared sensing device includes the following steps: forming a sacrificial layer on a substrate; forming a lower infrared absorbing structure on the sacrificial layer; forming an interdigitated electrode structure and an infrared sensing layer on the lower infrared absorbing structure; forming an upper infrared absorbing structure on the infrared sensing layer; and removing the sacrificial layer. The lower infrared absorbing structure, the interdigitated electrode structure, the infrared sensing layer, and the upper infrared absorbing structure compose an infrared sensing element. The infrared sensing layer is located in a sensing area of the infrared sensing element and does not extend into an infrared absorbing area of the infrared sensing element. The interdigitated electrode structure is located in the sensing area and in electrical contact with the infrared sensing layer, and the sensing area does not overlap the infrared absorbing area.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
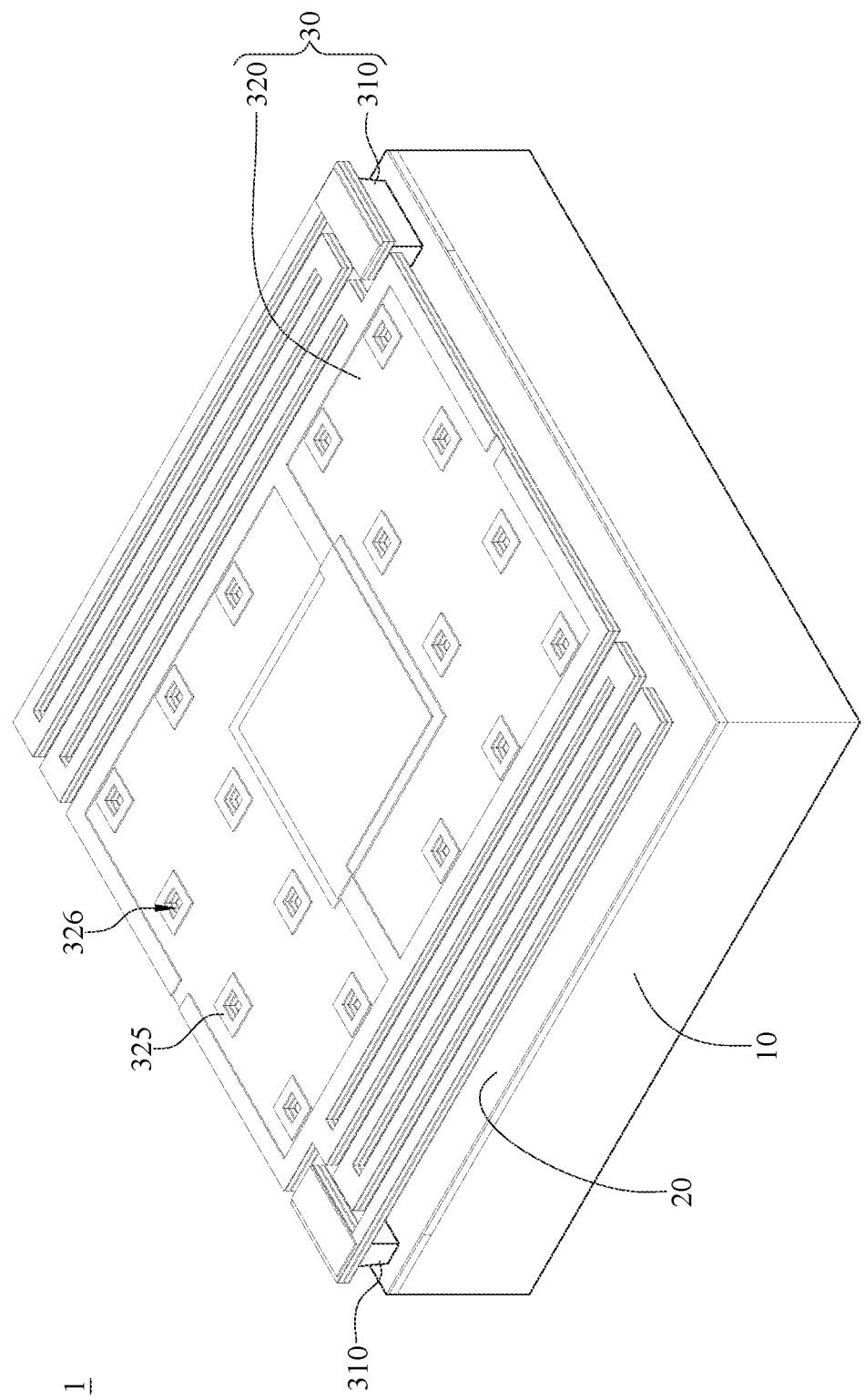
FIG. 1 is a perspective view of a MEMS infrared sensing device according to one embodiment of the disclosure.
Figure 2:
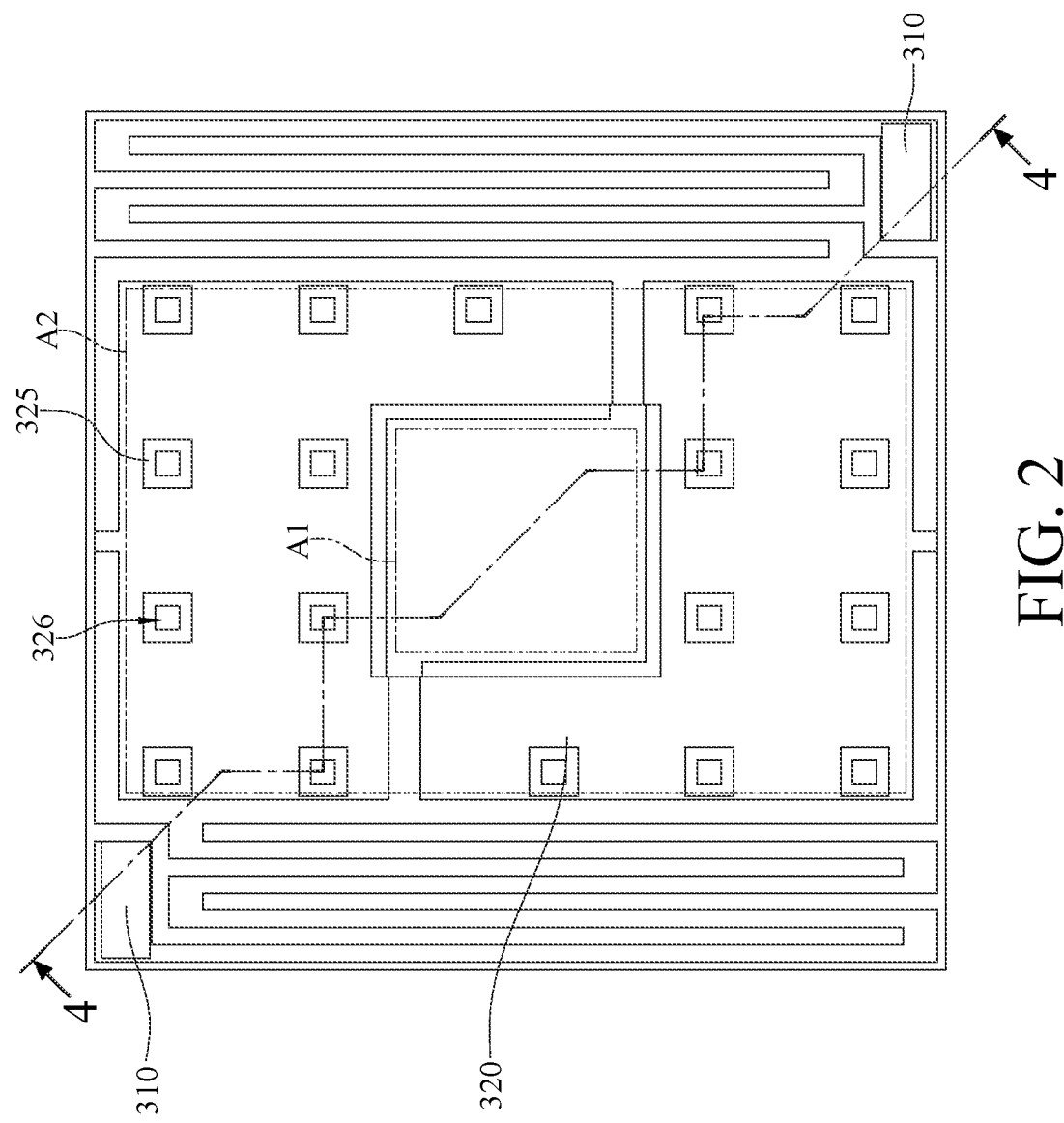
FIG. 2 is a top view of the MEMS infrared sensing device in FIG. 1.

Please refer to FIG. 1 and FIG. 2. FIG. 1 is a perspective view of a MEMS infrared sensing device according to one embodiment of the disclosure, and FIG. 2 is a top view of the MEMS infrared sensing device in FIG. 1. In this embodiment, a MEMS infrared sensing device 1 includes a substrate 10, an infrared reflective layer 20, a supporting element 30 and infrared sensing element 40.

The substrate 10, for example but not limited to, is a silicon substrate including read-out circuit. The infrared reflective layer 20, for example but not limited to, is a metallic film provided on the substrate 10.

The supporting element 30, for example but not limited to, is a metallic pillar located on the substrate 10, and the supporting element 30 is electrically connected with the read-out circuit in the substrate 10. The infrared sensing element 40 is suspended above the substrate 10 and the infrared reflective layer 20 by the supporting element 30. FIG. 1 exemplarily depicts a plurality of supporting elements 30 provided on the substrate 10, and the number of the supporting elements 30 is at least two in some embodiments.

Figure 3:
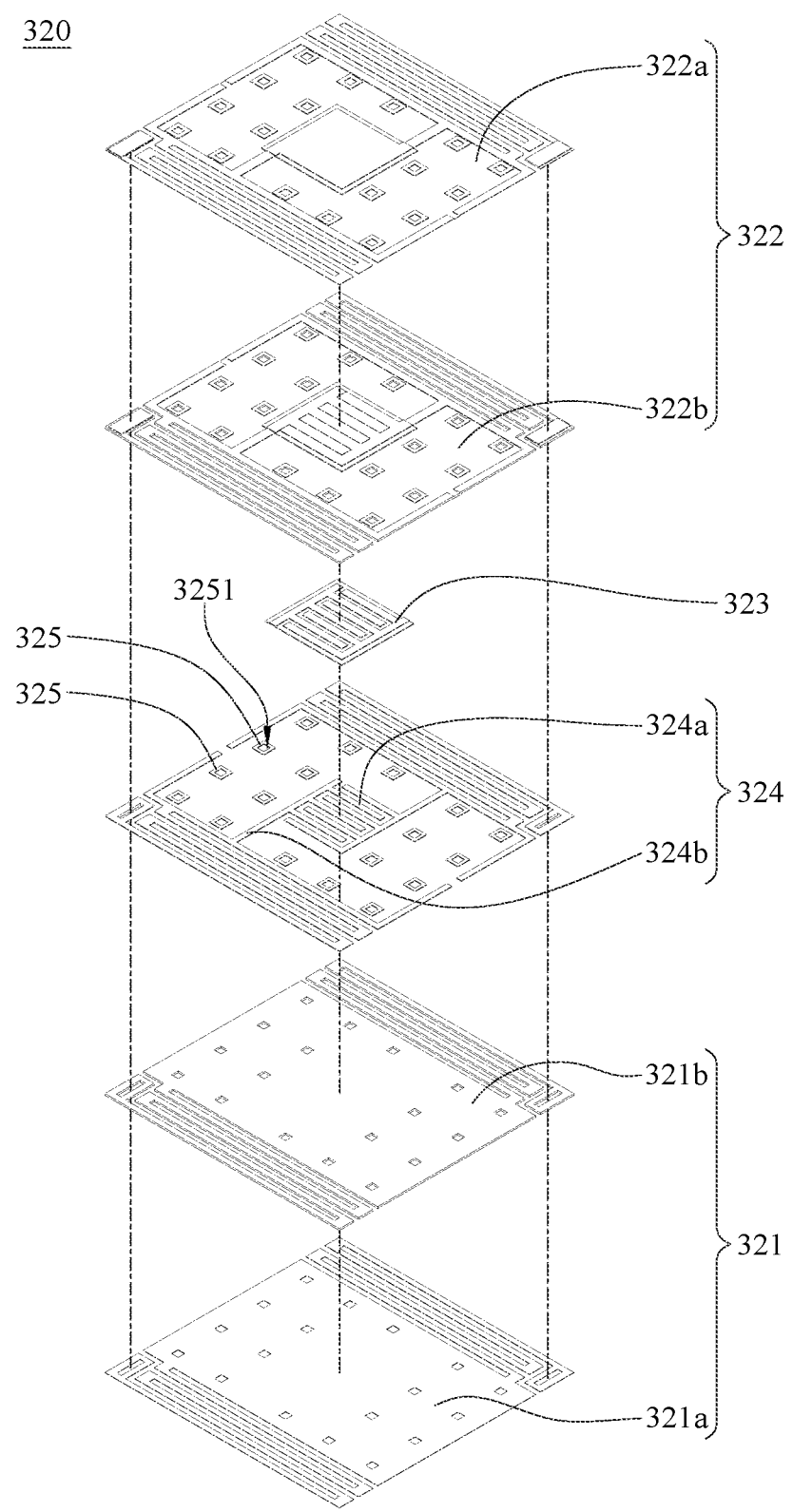
FIG. 3 is an exploded view of an infrared sensing element of the MEMS infrared sensing device in FIG. 1.
Figure 4:
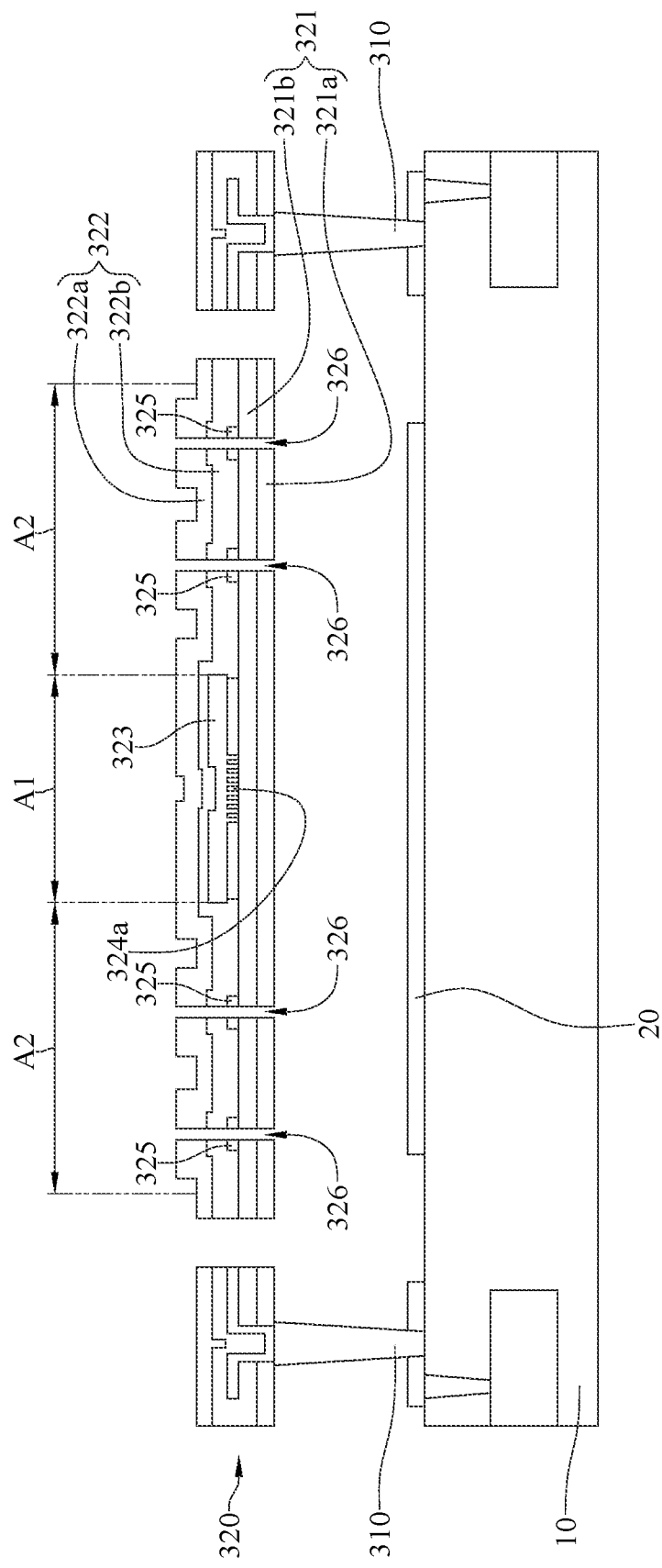
FIG. 4 is a cross-sectional view of the MEMS infrared sensing device in FIG. 1.

The infrared sensing element 40 is provided on the substrate 10, and the infrared reflective layer 20 is provided between the substrate 10 and the infrared sensing element 40. A sensing area A1 and an infrared absorbing area A2, which do not overlap each other, are defined on the infrared sensing element 40, and the infrared absorbing area A2 surrounds the sensing area A1. The infrared sensing element 40 includes a plurality of infrared absorbing structures, an infrared sensing layer 430 and a sensing electrode 440. Please refer to FIG. 3 and FIG. 4. FIG. 3 is an exploded view of an infrared sensing element of the MEMS infrared sensing device in FIG. 1, and FIG. 4 is a cross-sectional view of the MEMS infrared sensing device in FIG. 1. In this embodiment, the infrared sensing element 40 includes a lower infrared absorbing structure 410 close to the infrared reflective layer 20 and an upper infrared absorbing structure 420 away from the infrared reflective layer 20.

The lower infrared absorbing structure 410 is located in the sensing area A1 and the infrared absorbing area A2, and the lower infrared absorbing structure 410 includes a plurality of infrared absorbing layers formed layer-upon-layer. More specifically, the lower infrared absorbing structure 410 includes a first lower infrared absorbing layer 411, and a second lower infrared absorbing layer 412 disposed between the infrared sensing layer 430 and the first lower infrared absorbing layer 411. The first lower infrared absorbing layer 411 and the second lower infrared absorbing layer 412 are formed from different materials with different infrared spectrums, that is, the infrared absorbing layers may correspond to different infrared absorbance peaks. For example, the first lower infrared absorbing layer 411 is formed from silicon oxide, the second lower infrared absorbing layer 412 is formed from silicon nitride, and silicon oxide has different infrared absorbance peak from silicon nitride.

The upper infrared absorbing structure 420 is located in the sensing area A1 and the infrared absorbing area A2, and the upper infrared absorbing structure 420 includes a plurality of infrared absorbing layers formed layer-upon-layer. More Specifically, the upper infrared absorbing structure 420 includes a first upper infrared absorbing layer 421, and a second upper infrared absorbing layer 422 disposed between the infrared sensing layer 430 and the first upper infrared absorbing layer 421. The first upper infrared absorbing layer 421 and the second upper infrared absorbing layer 422 may be formed from different materials with different infrared spectrums, i.e. the infrared absorbing layers may correspond to different infrared absorbance peaks. For example, the first upper infrared absorbing layer 421 is formed from silicon oxide, the second upper infrared absorbing layer 422 is formed from silicon nitride, and silicon oxide has different infrared absorbance peak from silicon nitride.

In this embodiment, each of the lower infrared absorbing structure 410 and the upper infrared absorbing structure 420 includes multiple infrared absorbing layers, and the lower infrared absorbing structure 410 and the upper infrared absorbing structure 420 have the same configuration. Specifically, the term "same configuration" represents that when the lower infrared absorbing structure 410 and the upper infrared absorbing structure 420 both include, the infrared absorbing layers in each infrared absorbing structure have the same number of layers and the same number of materials, but their stacking order may be different. FIG. 4 exemplarily depicts that the lower infrared absorbing structure 410 and the upper infrared absorbing structure 420 have the same configuration, that is, each of the two infrared absorbing structures consists of two infrared absorbing layers (same number of layers), and the two infrared absorbing layers in each infrared absorbing structure is a combination of one silicon oxide layer with one silicon nitride layer (same number of materials). In some other embodiments, the infrared absorbing layers are, in order from bottom to top, may be the first lower infrared absorbing layer 411, the second lower infrared absorbing layer 412, the first upper infrared absorbing layer 421 and the second upper infrared absorbing layer 422.

Further, in this embodiment, a combination of the lower infrared absorbing structure 410 with the upper infrared absorbing structure 420 may be a stacked structure with a symmetrical configuration with respect to the infrared sensing layer 430. Specifically, the first lower infrared absorbing layer 411 of the lower infrared absorbing structure 410 and the first upper infrared absorbing layer 421 of the upper infrared absorbing structure 420 are formed from the same material (silicon oxide), and the second lower infrared absorbing layer 412 and the second upper infrared absorbing layer 422 are formed from the same material (silicon nitride). The exemplary materials, such as silicon oxide and silicon nitride, as the infrared light absorbing layer in this embodiment are not intended to limit the disclosure. In some other embodiments, the infrared absorbing layer may be formed from other materials (for example, silicon oxide containing nitrogen, or a composite material), and each infrared absorbing structure may include an infrared absorbing layer stack containing more than two infrared absorbing layers formed layer-upon-layer.

In this embodiment, the lower infrared absorbing structure 410 and the upper infrared absorbing structure 420 have the same thickness. In detail, the first lower infrared absorbing layer 411 and the first upper infrared absorbing layer 421 have the same thickness, and the second lower infrared absorbing layer 412 and the second upper infrared absorbing layer 422 have the same thickness.

The infrared sensing layer 430, for example but not limited to, is formed from amorphous silicon (a-Si) or composite material with high temperature coefficient of resistance (TCR), and the infrared sensing layer 430 is provided between the lower infrared absorbing structure 410 and the upper infrared absorbing structure 420. The infrared sensing layer 430 is located in the sensing area A1 and does not extend into the infrared absorbing area A2.

The sensing electrode 440 is in electrical contact with the infrared sensing layer 430. In detail, the sensing electrode 440 is provided between the lower infrared absorbing structure 410 and the upper infrared absorbing structure 420, and the sensing electrode 440 includes an interdigitated electrode structure 441 located in the sensing area A1 and a linkage arm structure 442 located in the infrared absorbing area A2. The interdigitated electrode structure 441 may not extend into the infrared absorbing area A2. The interdigitated electrode structure 441 is in electrical contact with the infrared sensing layer 430, and the interdigitated electrode structure 441 is in electrical contact with the supporting elements 30 through the linkage arm structure 442 so as to be connected with the substrate 10. In this embodiment, the interdigitated electrode structure 441 is provided between the infrared sensing layer 430 and the lower infrared absorbing structure 410. In some other embodiments, the interdigitated electrode structure may be located between the infrared sensing layer and the upper infrared absorbing structure.

A method for fabricating the MEMS infrared sensing device 1 is described hereafter. Please refer to FIG. 5 through FIG. 12 showing schematic views of fabrication of the MEMS infrared sensing device in FIG. 1. The following discloses specific steps for fabricating the MEMS infrared sensing device 1, while said implementation in each step is not intended to limit the disclosure.

Figure 5:
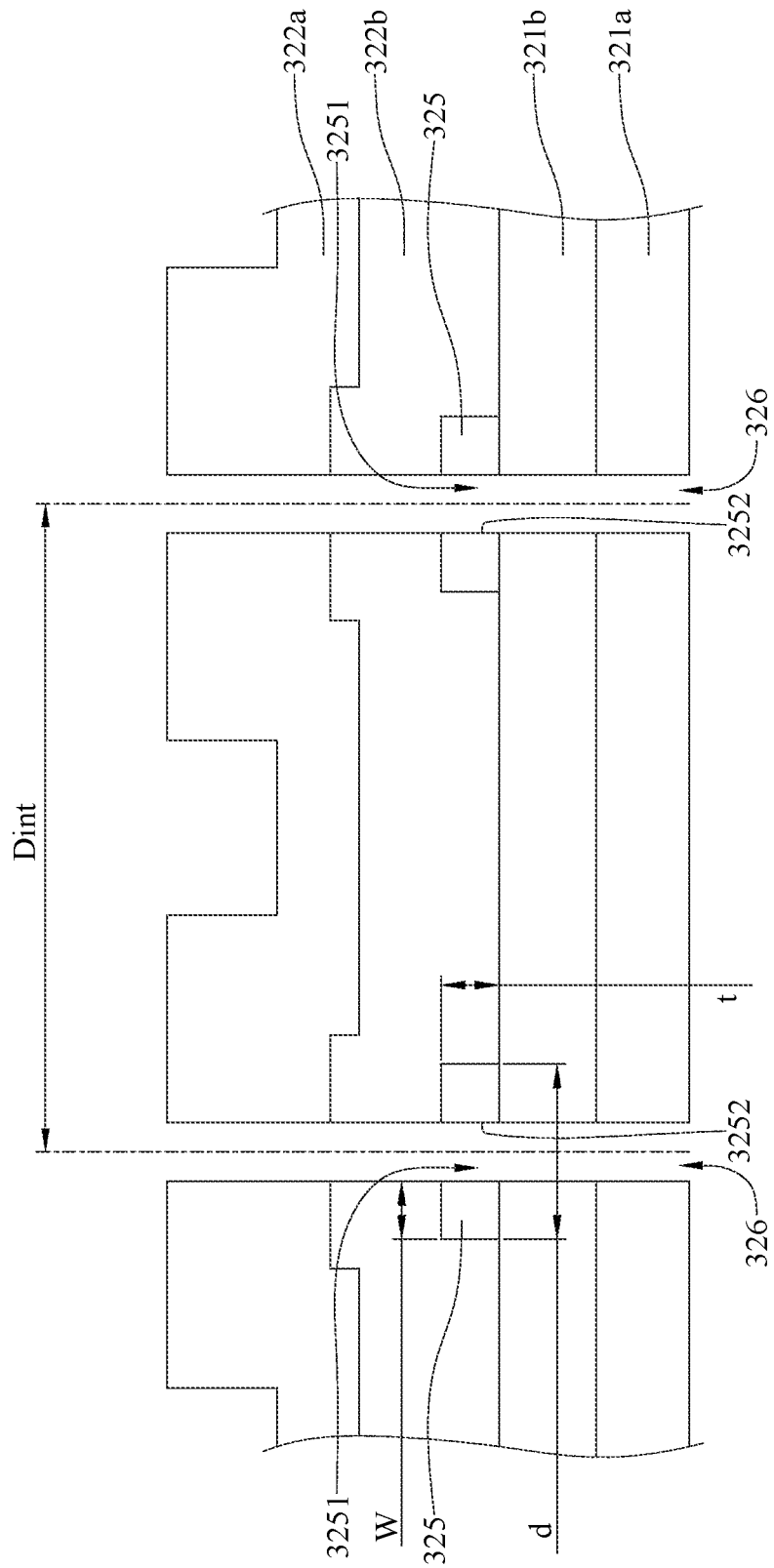
FIG. 5 through FIG. 12 are schematic views of fabrication of the MEMS infrared sensing device in FIG. 1.

As shown in FIG. 5, the substrate 10 including read-out circuit is provided, and the infrared reflective layer 20 and the sacrificial layer 50 are sequentially formed on the substrate 10. Specifically, a metallic layer (for example, a 300 nm thick aluminum layer) is deposited on the substrate 10, and the metallic layer is patterned to thereby form the infrared reflective layer 20. After the formation of the infrared reflective layer 20, the sacrificial layer 50, such as a 1000~1500 nm thick a-Si layer, is deposited on the substrate 10 and the infrared reflective layer 20. Optionally, silicon oxide material (SiOx) may be formed on the infrared reflective layer 20 as a protective layer before the formation of the sacrificial layer 50, which is helpful to prevent unfavorable influence on the infrared reflective layer 20 due to the material of the sacrificial layer 50. The patterning of the metallic layer may be performed by photolithography process and/or etching process.

Figure 6:
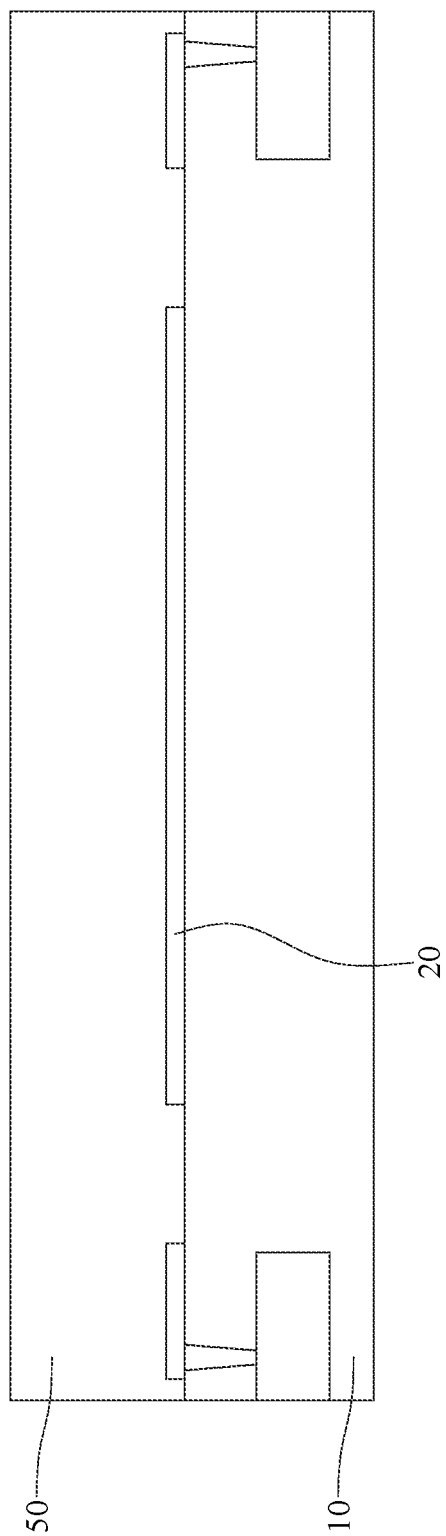
Figure 7:
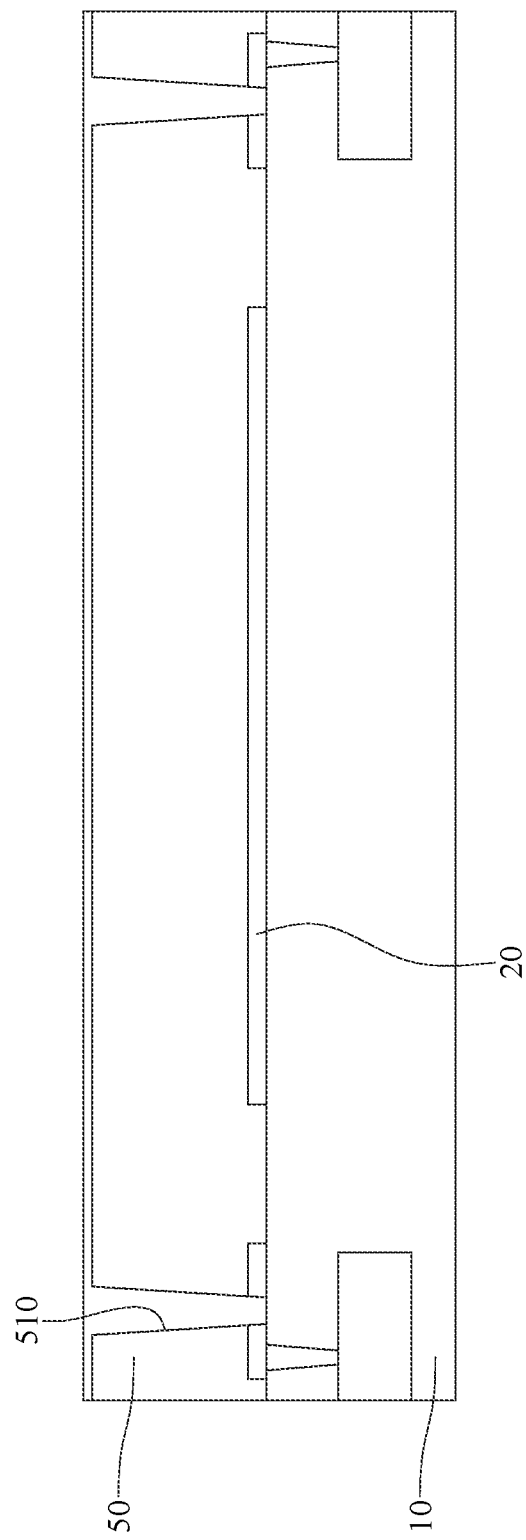

As shown in FIG. 6 and FIG. 7, the supporting elements 30 are formed in the sacrificial layer 50. Specifically, part of the sacrificial layer 50 is removed by etching to form through holes 510, and then the supporting elements 30 are formed in respective through holes 510. An electrically conductive material, such as tungsten, may be deposited on the top surface of the sacrificial layer 50 and in the through holes 510, and a portion of the electrically conductive material on the sacrificial layer 50 may be removed to form the supporting elements 30. More specifically, the electrically conductive material and the sacrificial layer 50 may be partially removed to form the supporting elements 30 by chemical mechanical planarization (CMP) in order to ensure a flat top surface of the sacrificial layer 50.

Figure 8:
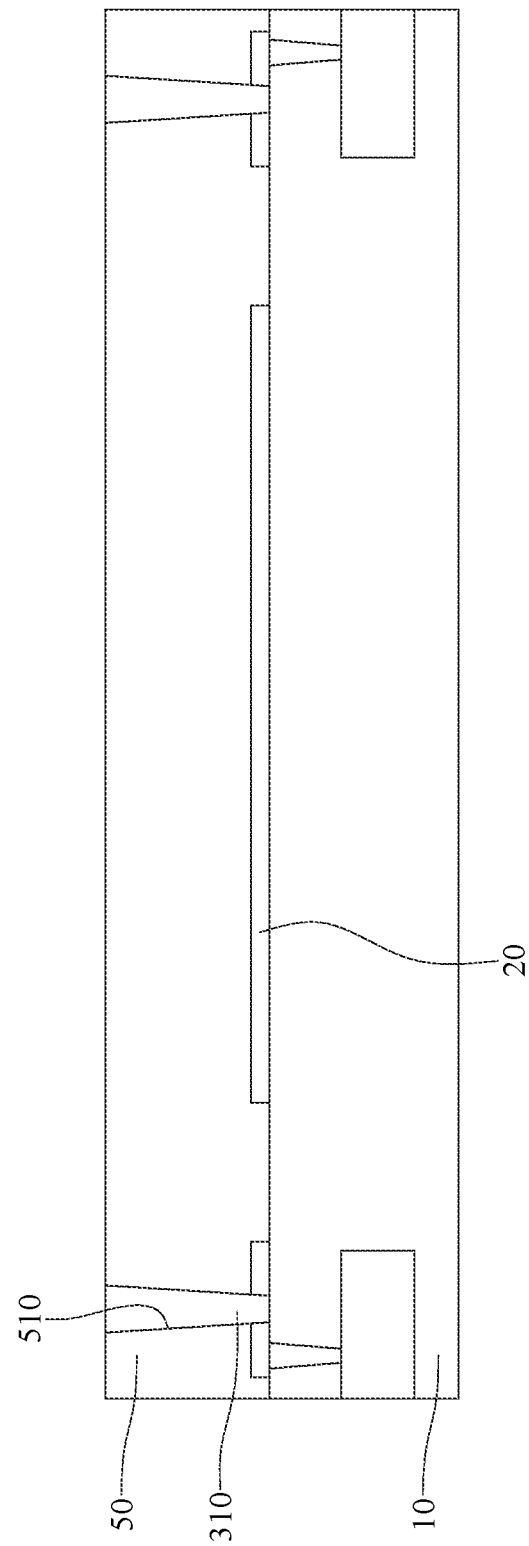

As shown in FIG. 8, the lower infrared absorbing structure 410 is formed on the sacrificial layer 50. Specifically, a silicon oxide layer of about 40~100 nm is firstly deposited to cover the supporting elements 30 and the sacrificial layer 50, and then a silicon nitride layer of about 100~170 nm is deposited on the silicon oxide layer. The silicon oxide layer and the silicon nitride layer serve as the first lower infrared absorbing layer 411 and the second lower infrared absorbing layer 412 of the lower infrared absorbing structure 410, respectively.

Figure 9:
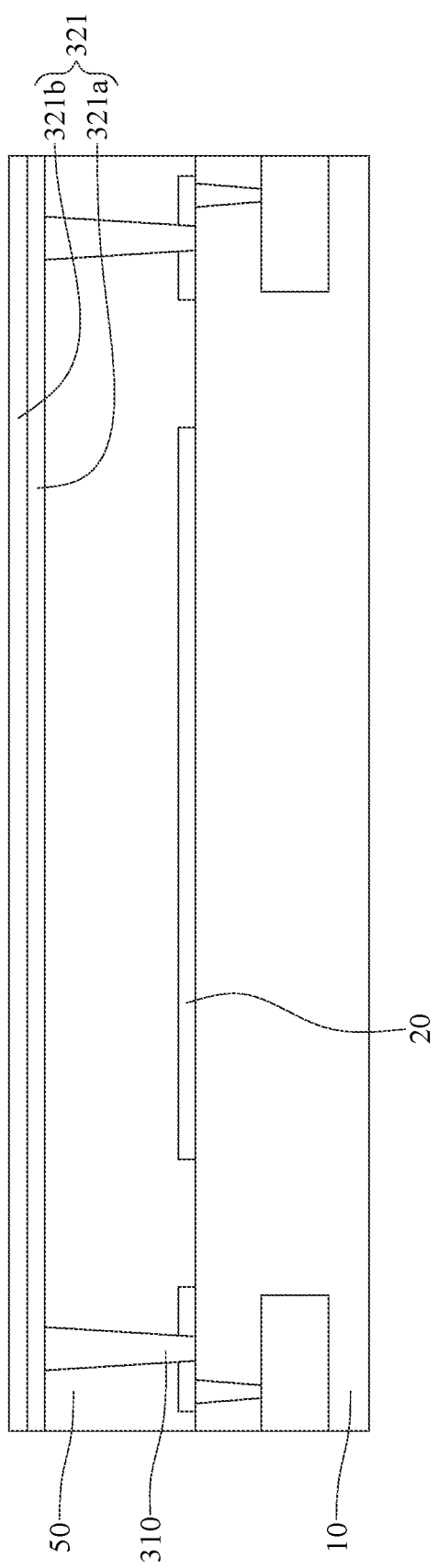

As shown in FIG. 9, the sensing electrode 440 is formed on the lower infrared absorbing structure 410. Specifically, after the formation of the lower infrared absorbing structure 410 by depositing the silicon oxide layer and the silicon nitride layer, the silicon oxide layer and the silicon nitride layer are partially removed to expose the supporting elements 30; or, before the deposition of the silicon oxide layer and the silicon nitride layer, the supporting elements 30 are covered by a mask, so that the supporting elements 30 can expose to outside by removal of the mask after said deposition. Then, an electrically conductive layer, such as about 50~100 nm thick titanium nitride, is deposited on the top surface of the lower infrared absorbing structure 410 and the supporting elements 30, and the electrically conductive layer is patterned to form the sensing electrode 440. Optionally, part of the electrically conductive layer may be left around the sensing electrode 440 for forming signal transmission traces in the subsequent process. The patterning of the electrically conductive layer may be performed by photolithography process and/or etching process.

Figure 10:
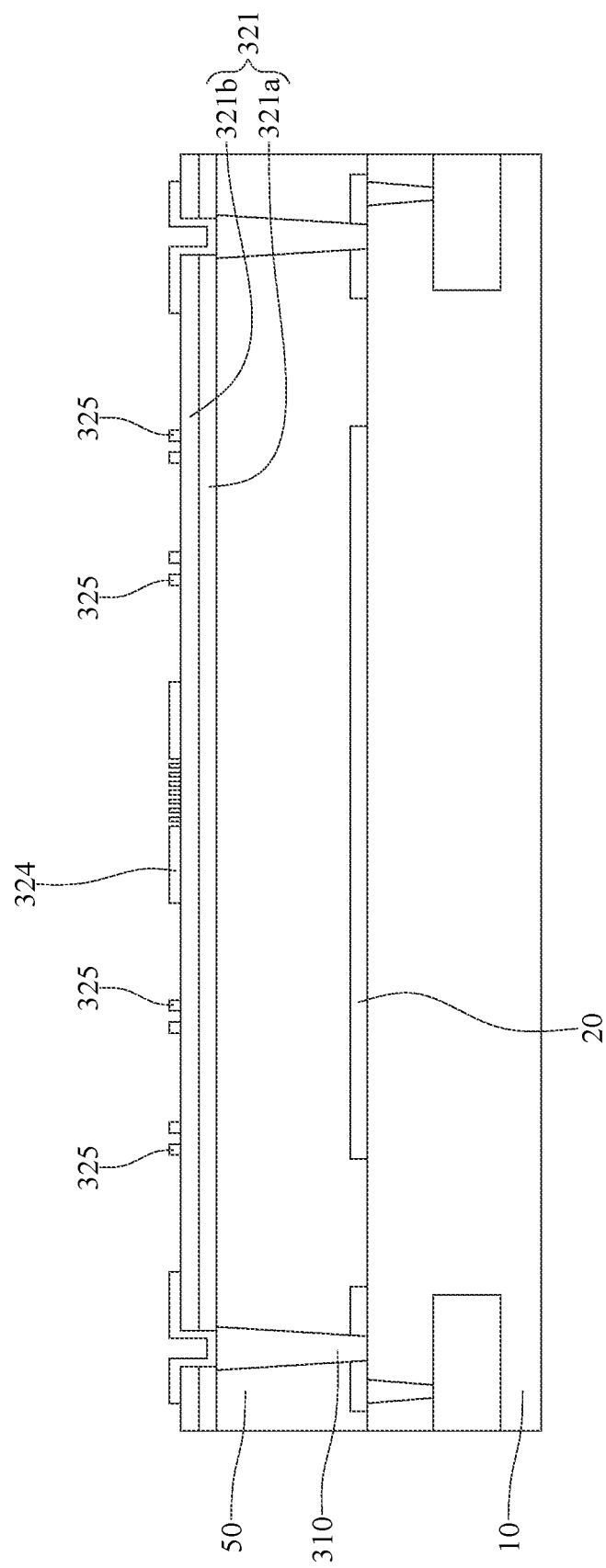

As shown in FIG. 10, the infrared sensing layer 430 is formed on the sensing electrode 440. Specifically, a material layer with high TCR, such as about 50~100 nm thick a-Si, is deposited on the sensing electrode 440, and then the material layer is patterned to form the infrared sensing layer 430 on the interdigitated electrode structure 441 of the sensing electrode 440. A region where the material layer is removed can be defined as the infrared absorbing area A2 of the infrared sensing element 40 in FIG. 4, and another region where the infrared sensing layer 430 and the interdigitated electrode structure 441 are located can be defined as the sensing area A1 in FIG. 4. The patterning of the material layer may be performed by photolithography process and/or etching process. In FIG. 9 and FIG. 10, the sensing electrode 440 is firstly formed and the infrared sensing layer 430 is then formed, but the disclosure is not limited thereto. In some embodiments, the infrared sensing layer may be firstly formed, followed by the formation of the sensing layer.

Figure 11:
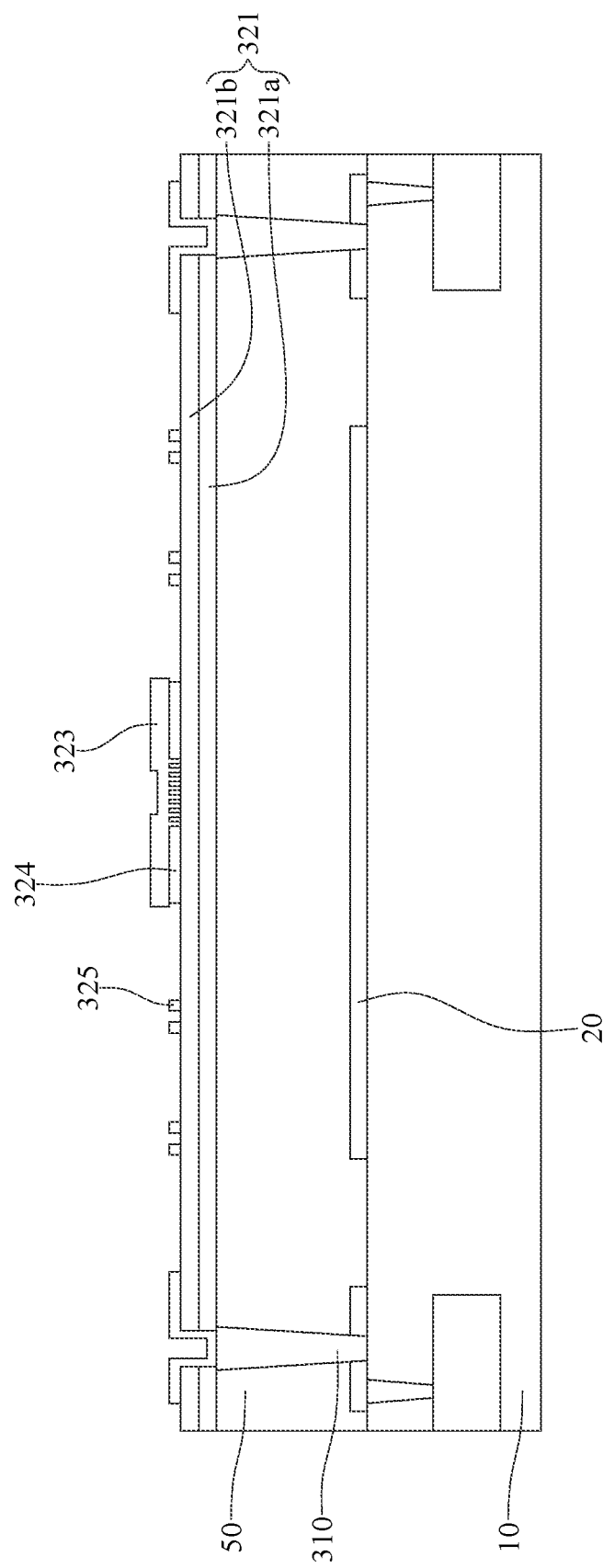

As shown in FIG. 11, the upper infrared absorbing structure 420 is formed on the infrared sensing layer 430. Specifically, a silicon nitride layer of about 100~170 nm is firstly deposited to cover the infrared sensing layer 430 and the sensing electrode 440, a silicon oxide layer of about 40~100 nm is deposited on the silicon nitride layer, and then the silicon nitride layer and the silicon oxide layer are patterned to form the first upper infrared absorbing layer 421 and the second upper infrared absorbing layer 422 of the upper infrared absorbing structure 420. The upper infrared absorbing structure 420 covers top surface and lateral surfaces of the infrared sensing layer 430. The patterning of the layers may be performed by photolithography process and/or etching process.

Figure 12:
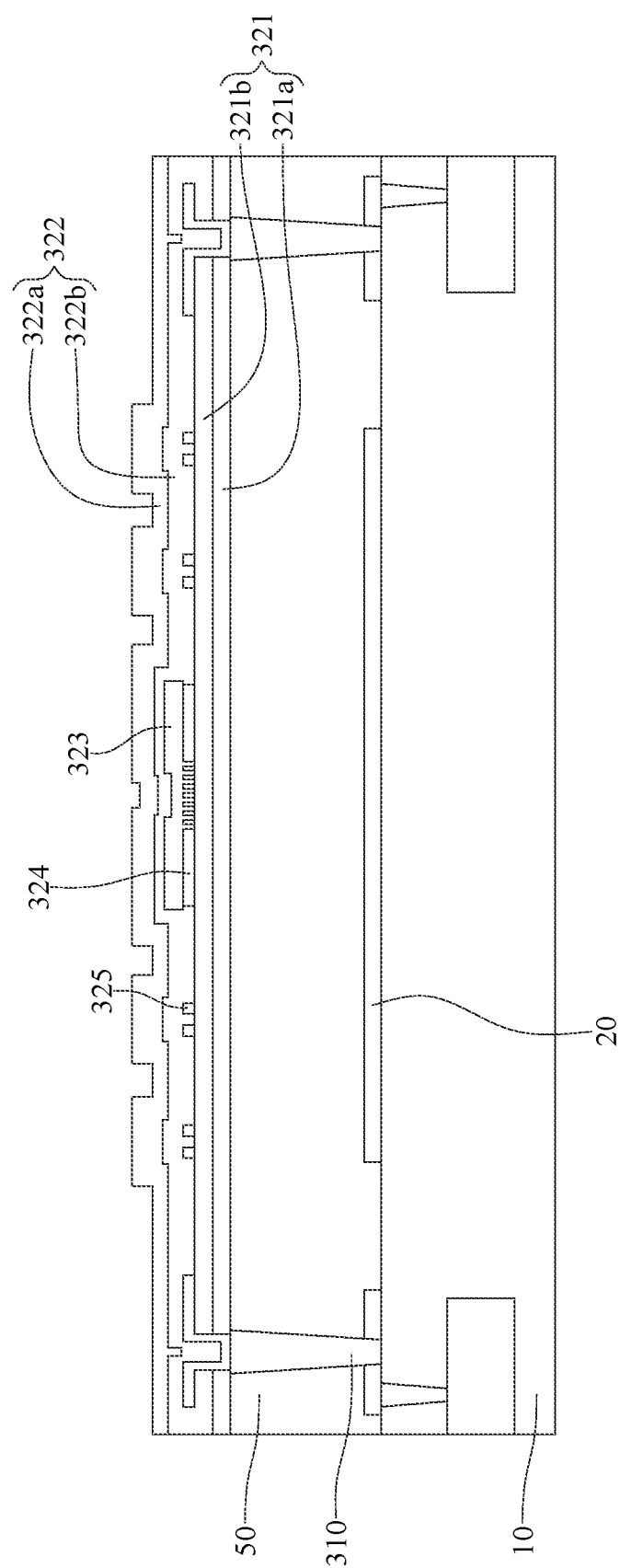

As shown in FIG. 12, part of the lower infrared absorbing structure 410 and part of the upper infrared absorbing structure 420 are removed to form a resilient arm 450 of the infrared sensing element 40 in the infrared absorbing area A2. The sacrificial layer 50 is removed by etching to form a gap between the lower infrared absorbing structure 410 and the infrared reflective layer 20. Moreover, in addition to the removal of partial lower infrared absorbing structure 410 and partial upper infrared absorbing structure 420, the electrically conductive layer remaining around the sensing electrode 440 may be also partially removed to form signal transmission traces.

When infrared light travels into the MEMS infrared sensing device 1, the radiant energy of infrared light passing through the infrared sensing element 40 can be absorbed by the lower infrared absorbing structure 410 and the upper infrared absorbing structure 420, and thus the temperature of the infrared sensing layer 430 contacting the lower infrared absorbing structure 410 and the upper infrared absorbing structure 420 rises. A rise in the temperature of the infrared sensing layer 430 leads to a change in its electrical resistance, which results in a change in an overall electrical resistance of the infrared sensing layer 430 and the sensing electrode 440 which is in electrical contact with each other, so that the read-out circuit in the substrate 10 can receive electrical signals (such as a change in voltage or a change in electrical current).

In this embodiment, each infrared absorbing structure (lower infrared absorbing structure 410 and upper infrared absorbing structure 420) includes multiple infrared absorbing layers. Since infrared light from the external environment usually contains multiple wavelengths, the infrared absorbing structure is helpful to increase infrared absorbance so as to increase a fill factor of the MEMS infrared sensing device 1. Furthermore, the lower infrared absorbing structure 410 and the upper infrared absorbing structure 420, which are arranged symmetrically, may have the same or similar material properties (for example, thermal expansion coefficient or Young's modulus), configuration and size, so that unfavorable warpage or thermal stress in the infrared sensing element 40 can be prevented during the fabrication of the MEMS infrared sensing device 1, thereby improving manufacturing yield rate of the MEMS infrared sensing device 1.

In addition, in this embodiment, the sensing electrode 440 includes the interdigitated electrode structure 441, and the interdigitated electrode structure 441 enjoys small gap between adjacent electrodes and low electrical resistance compared to conventional electrode structure, so that the interdigitated electrode structure 441 can achieve sufficiently small noise equivalent temperature difference (NETD) for the requirements of compact as well as thermally sensitive MEMS infrared sensing device 1 by providing a smaller working area than conventional electrode structure. Meanwhile, due to a small working area of the interdigitated electrode structure 441, the size of the infrared sensing layer 430, which should overlap the interdigitated electrode structure 441, can also be reduced, which means that the working area of the infrared absorbing layer for absorbing infrared light can be increased so as to further increase the fill factor of the MEMS infrared sensing device 1.

Besides, according to the fabrication method disclosed herein, since the lower infrared absorbing structure 410 of the infrared sensing element 40 is formed on the sacrificial layer 50 processed by CMP, a flat surface of the lower infrared absorbing structure 410 is provided at a side facing toward the infrared reflective layer 20 after removal of the sacrificial layer 50. The lower infrared absorbing structure 410 having flat bottom surface ensures a consistent distance between the infrared sensing element 40 and the infrared reflective layer 20, thereby enabling the MEMS infrared sensing device 1 to achieve optimal sensing performance. The consistent distance together with the symmetrical configuration of the infrared absorbing structure design can further improve manufacturing yield rate of the MEMS infrared sensing device 1.

Figure 13:
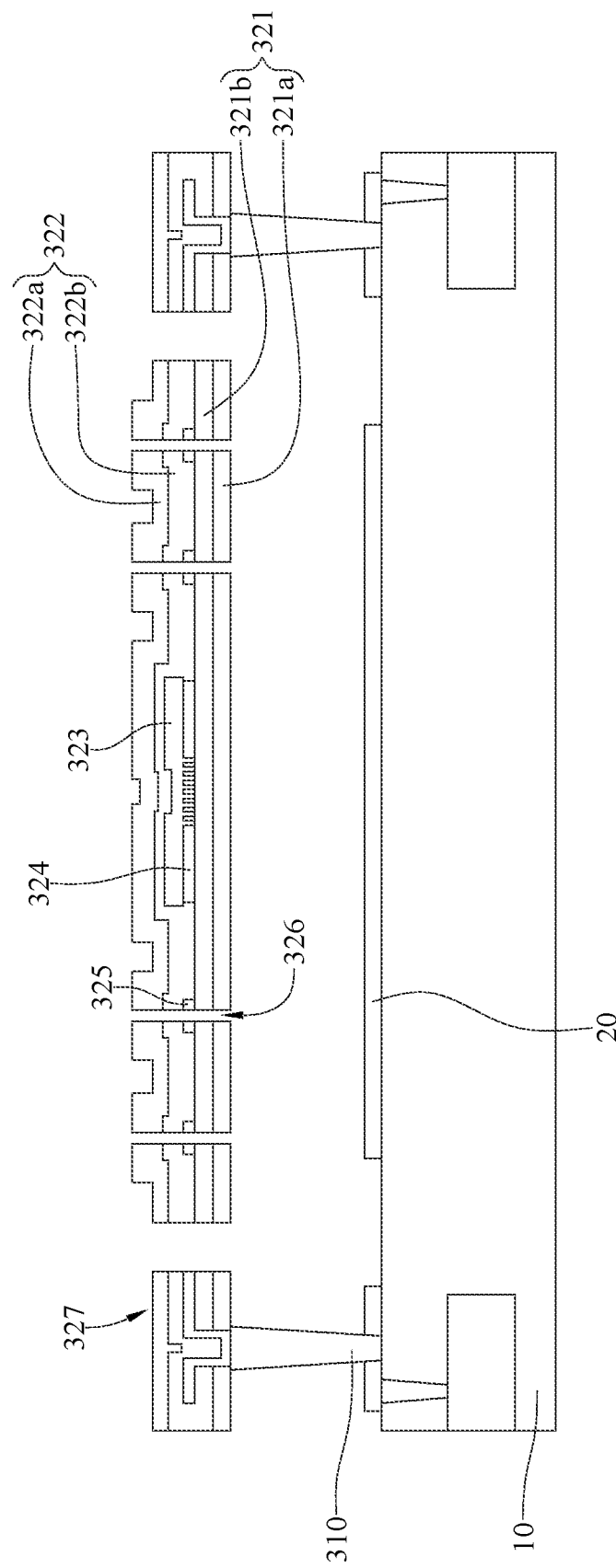
FIG. 13 is a cross-sectional view of a MEMS infrared sensing device according to another embodiment of the disclosure.

FIG. 13 is a cross-sectional view of a MEMS infrared sensing device according to another embodiment of the disclosure. In this embodiment, a MEMS infrared sensing device 2 includes a substrate 10, an infrared reflective layer 20, a supporting element 30 and an infrared sensing element 40". The infrared sensing element 40" includes a lower infrared absorbing structure 410", an upper infrared absorbing structure 420", an infrared sensing layer 430 and a sensing electrode 440. Each of the lower infrared absorbing structure 410" and the upper infrared absorbing structure 420" includes single infrared absorbing layer, and the lower infrared absorbing structure 410" and the upper infrared absorbing structure 420" are formed from different materials. For example, the upper infrared absorbing structure 420" includes single silicon oxide layer, while the lower infrared absorbing structure 410" includes single silicon nitride layer.

Figure 14:
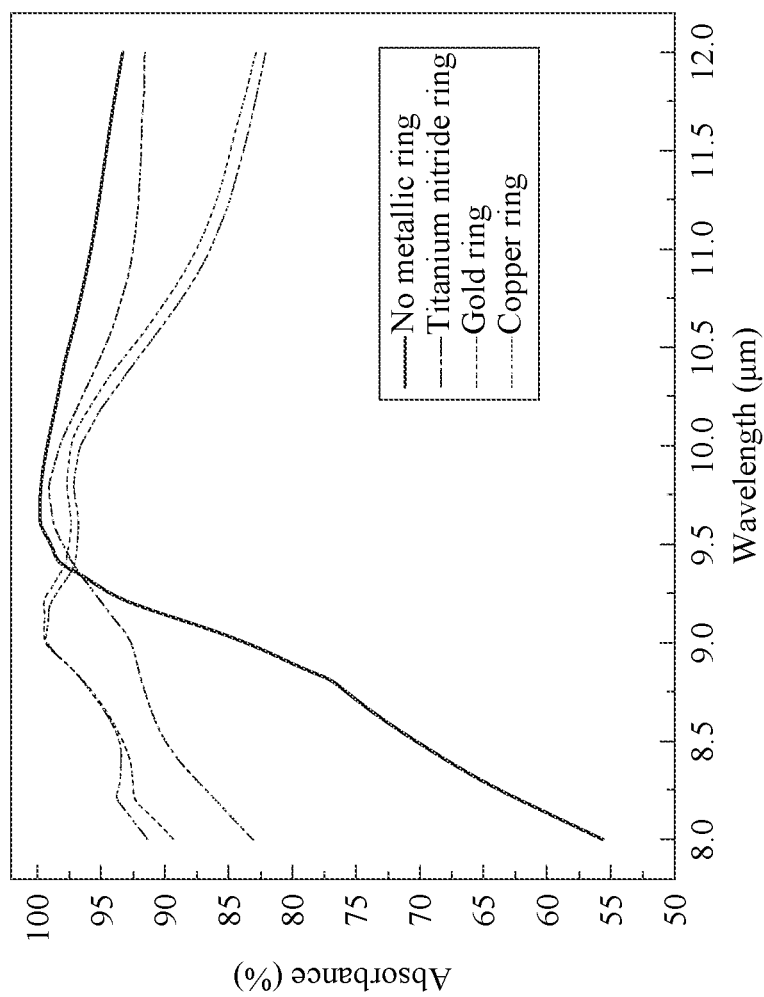
FIG. 14 is a cross-sectional view of a MEMS infrared sensing device according to yet another embodiment of the disclosure.

FIG. 14 is a cross-sectional view of a MEMS infrared sensing device according to yet another embodiment of the disclosure. In this embodiment, a MEMS infrared sensing device 3 includes a substrate 10, an infrared reflective layer 20, a supporting element 30 and an infrared sensing element 40A. The infrared sensing element 40A includes a lower infrared absorbing structure 410A, an upper infrared absorbing structure 420A, an infrared sensing layer 430 and a sensing electrode 440. The lower infrared absorbing structure 410A and the upper infrared absorbing structure 420A jointly form an infrared absorbing layer stack 6. The infrared absorbing layer stack 6 includes multiple infrared absorbing layers with more than one kind of materials and interlaced layer-upon-layer. In one exemplary embodiment, some of the infrared absorbing layers are formed from a first material, and the others of the infrared absorbing layers are formed from a second material different from the first material. The infrared absorbing layers formed from the first material and the infrared absorbing layers formed from the second material are interlaced layer-upon-layer.

In detail, the lower infrared absorbing structure 410A shown in FIG. 14 includes one infrared absorbing layer 413 and one infrared absorbing layer 414 which are below the sensing electrode 440, and the infrared absorbing layers 413, 414 may be formed from different materials; for example, the infrared absorbing layer 413 may be formed from silicon oxide, and the infrared absorbing layer 414 may be formed from silicon nitride. The upper infrared absorbing structure 420A includes two infrared absorbing layers 423 and one infrared absorbing layer 424 which are above the sensing electrode 440, and the infrared absorbing layers 423, 424 may be formed from different materials; for example, the infrared absorbing layer 423 may be formed from silicon oxide, and the infrared absorbing layer 424 may be formed from silicon nitride.

Figure 15:
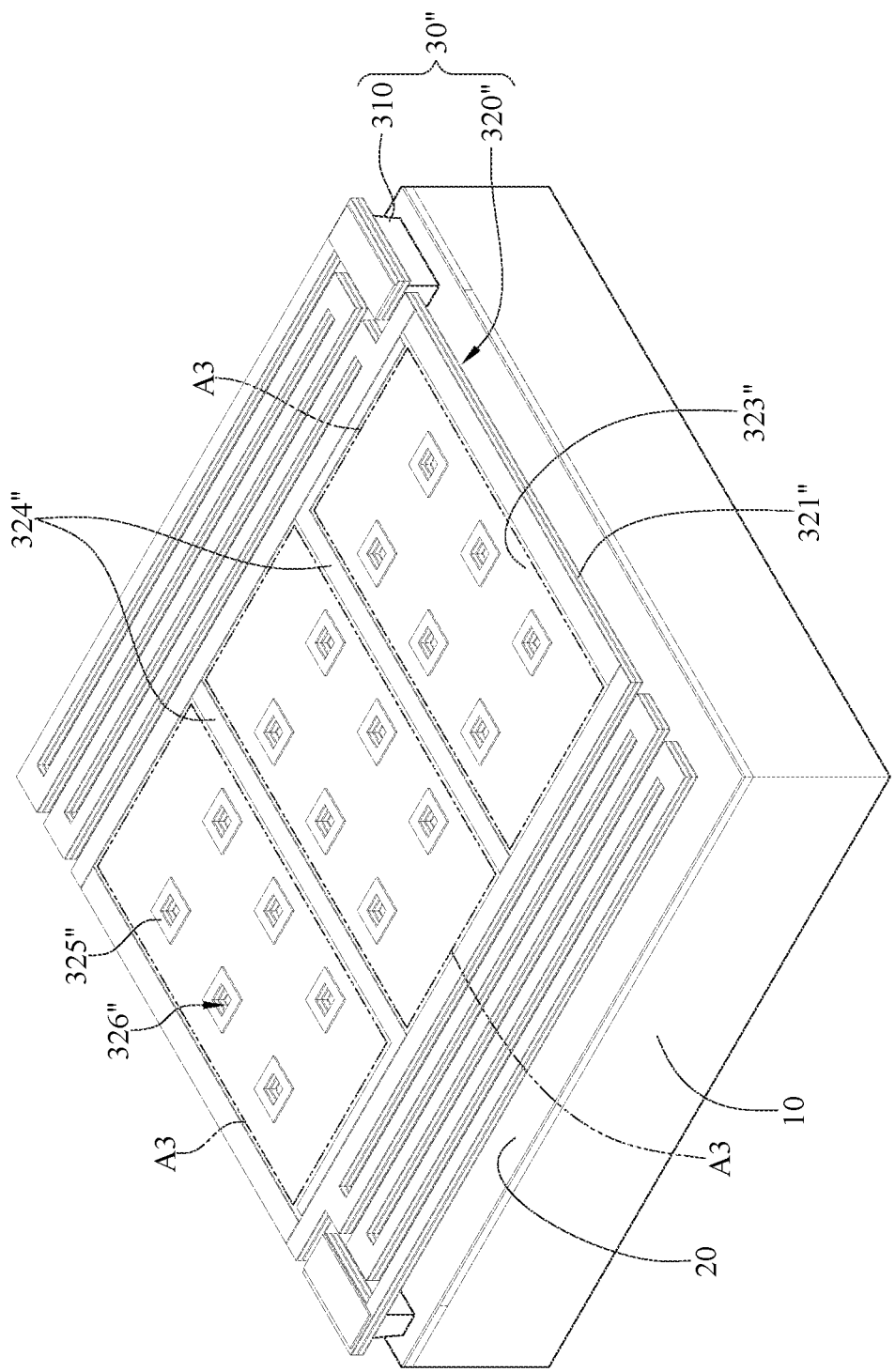
FIG. 15 is a cross-sectional view of a MEMS infrared sensing device according to still another embodiment of the disclosure.

FIG. 15 is a cross-sectional view of a MEMS infrared sensing device according to still another embodiment of the disclosure. In this embodiment, a MEMS infrared sensing device 4 includes a substrate 10, an infrared reflective layer 20, a supporting element 30 and an infrared sensing element 40B. The infrared sensing element 40B includes a lower infrared absorbing structure 410B, an upper infrared absorbing structure 420B, an infrared sensing layer 430 and a sensing electrode 440. The lower infrared absorbing structure 410B and the upper infrared absorbing structure 420B jointly form an infrared absorbing layer stack 6'. The infrared absorbing layer stack 6' includes multiple infrared absorbing layers with more than one kind of materials and interlaced layer-upon-layer. In one exemplary embodiment, some of the infrared absorbing layers are formed from a first material, and the others of the infrared absorbing layers are formed from a second material different from the first material. The infrared absorbing layers formed from the first material and the infrared absorbing layers formed from the second material are interlaced layer-upon-layer.

In detail, the lower infrared absorbing structure 410B shown in FIG. 15 includes two infrared absorbing layers 413 and one infrared absorbing layer 414 which are below the sensing electrode 440, and the infrared absorbing layers 413, 414 may be formed from different materials; for example, the infrared absorbing layer 413 may be formed from silicon oxide, and the infrared absorbing layer 414 may be formed from silicon nitride. The upper infrared absorbing structure 420B includes one infrared absorbing layer 423 and one infrared absorbing layer 424 which are above the sensing electrode 440, and the infrared absorbing layers 423, 424 may be formed from different materials; for example, the infrared absorbing layer 423 may be formed from silicon oxide, and the infrared absorbing layer 424 may be formed from silicon nitride.

According to the disclosure, the infrared absorbing structure is helpful to increase infrared absorbance so that the fill factor of the MEMS infrared sensing device can be increased, and also improve manufacturing yield of the MEMS infrared sensing device by preventing unfavorable warpage or thermal stress in the MEMS infrared sensing device. The interdigitated electrode structure can enjoy small working area while satisfying the requirements related to thermal sensitivity, and the size of the infrared sensing layer can also be reduced to provide large working area of the infrared absorbing layer, thereby further increasing the fill factor of the MEMS infrared sensing device. The infrared absorbing structure has uniform stress distribution due to its symmetrical configuration, which results in the infrared absorbing structure with flat surface and no warpage; thus a consistent distance can be provided between the infrared sensing element and the infrared reflective layer, which is helpful to keep stable and accurate operation of the MEMS infrared sensing device. With one or more of aforementioned features, the disclosure enables a MEMS infrared sensing device with low NETD and large fill factor.

It will be apparent to those skilled in the art that various modifications and variations can be formed from the disclosure. It is intended that the specification and examples be considered as exemplary embodiments only, with a scope of the disclosure being indicated by the following claims and their equivalents.

What is claimed is:

1. A microelectromechanical (MEMS) infrared sensing device, comprising:
   a substrate; and
   an infrared sensing element provided above the substrate, wherein the infrared sensing element has a sensing area and an infrared absorbing area which do not overlap each other, and the infrared sensing element comprising:
      two infrared absorbing structures, wherein each of the two infrared absorbing structures comprises at least one infrared absorbing layer, and the two infrared absorbing structures are located in the sensing area and the infrared absorbing area;
      an infrared sensing layer provided between the two infrared absorbing structures, wherein the infrared sensing layer is located in the sensing area and does not extend into the infrared absorbing area; and
      an interdigitated electrode structure located in the sensing area, wherein the interdigitated electrode structure is in electrical contact with the infrared sensing layer.

2. The MEMS infrared sensing device according to claim 1, wherein each of the two infrared absorbing structures comprises a plurality of infrared absorbing layers formed layer-upon-layer.

3. The MEMS infrared sensing device according to claim 1, wherein each of the two infrared absorbing structures comprises a plurality of infrared absorbing layers, and the two infrared absorbing structures have the same thickness and the same configuration.

4. The MEMS infrared sensing device according to claim 1, wherein one of the two infrared absorbing structures is a lower infrared absorbing structure close to the substrate and the other one of the two infrared absorbing structures is an upper infrared absorbing structure away from the substrate, the lower infrared absorbing structure comprises a first lower infrared absorbing layer and a second lower infrared absorbing layer disposed between the infrared sensing layer and the first lower infrared absorbing layer, the upper infrared absorbing structure comprises a first upper infrared absorbing layer and a second upper infrared absorbing layer disposed between the infrared sensing layer and the first upper infrared absorbing layer, the first lower infrared absorbing layer and the first upper infrared absorbing layer have a first material, the second lower infrared absorbing layer and the second upper infrared absorbing layer have a second material, and the first material is different from the second material.

5. The MEMS infrared sensing device according to claim 4, wherein the lower infrared absorbing structure and the upper infrared absorbing structure have same thickness.

6. The MEMS infrared sensing device according to claim 4, wherein the first lower infrared absorbing layer and the first upper infrared absorbing layer have same thickness, and the second lower infrared absorbing layer and the second upper infrared absorbing layer have same thickness.

7. The MEMS infrared sensing device according to claim 1, wherein the two infrared absorbing structures compose an infrared absorbing layer stack, and the infrared absorbing layer stack comprises a plurality of infrared absorbing layers, some of the infrared absorbing layers are formed from a first material and the others of the infrared absorbing layers are formed from a second material different from the first material, the infrared absorbing layers formed from the first material and the infrared absorbing layers formed from the second material are interlaced.

8. The MEMS infrared sensing device according to claim 1, further comprising an infrared reflective layer provided between the substrate and the infrared sensing element.

9. The MEMS infrared sensing device according to claim 1, wherein the interdigitated electrode structure is located between the infrared sensing layer and any one of the two infrared absorbing structures.

10. The MEMS infrared sensing device according to claim 1, further comprising a plurality of supporting elements disposed on the substrate, wherein the supporting elements are connected with the infrared sensing element to suspend the infrared sensing element above the substrate.

11. The MEMS infrared sensing device according to claim 10, wherein the supporting elements are formed from metallic material, and the interdigitated electrode structure is in electrical contact with the supporting elements.

12. A method for fabricating MEMS infrared sensing device, comprising:
   forming a sacrificial layer on a substrate;
   forming a lower infrared absorbing structure on the sacrificial layer;
   forming an interdigitated electrode structure and an infrared sensing layer on the lower infrared absorbing structure;
   forming an upper infrared absorbing structure on the infrared sensing layer; and
   removing the sacrificial layer
   wherein the lower infrared absorbing structure, the interdigitated electrode structure, the infrared sensing layer, and the upper infrared absorbing structure compose an infrared sensing element, the infrared sensing layer is located in a sensing area of the infrared sensing element and does not extend into an infrared absorbing area of the infrared sensing element, the interdigitated electrode structure is located in the sensing area and in electrical contact with the infrared sensing layer, and the sensing area does not overlap the infrared absorbing area.

13. The method according to claim 12, further comprising:
    forming a plurality of through holes in the sacrificial layer;
    depositing an electrically conductive material in the through holes; and
    removing part of the electrically conductive material to form a plurality of supporting elements.

14. The method according to claim 13, wherein the electrically conductive material is removed by chemical mechanical planarization.

15. The method according to claim 13, wherein the step of forming the interdigitated electrode structure on the lower infrared absorbing structure comprises:
    removing part of the lower infrared absorbing structure to expose the supporting elements;
    depositing an electrically conductive layer on a top surface of the lower infrared absorbing structure and the supporting elements; and
    patterning the electrically conductive layer to form the interdigitated electrode structure.

16. The method according to claim 12, wherein the step of forming the lower infrared absorbing structure on the sacrificial layer comprises forming a plurality of infrared absorbing layers of the lower infrared absorbing structure on the sacrificial layer, and
    the step of forming the upper infrared absorbing structure on the infrared sensing layer comprises forming a plurality of infrared absorbing layers of the upper infrared absorbing structure on the infrared sensing layer.

17. The method according to claim 12, wherein each of the lower infrared absorbing structure and the upper infrared absorbing structure comprises a plurality of infrared absorbing layers, and the lower infrared absorbing structure and the upper infrared absorbing structure have same thickness and same configuration.

18. The method according to claim 17, wherein the step of forming the lower infrared absorbing structure on the sacrificial layer comprises forming a first lower infrared absorbing layer and a second lower infrared absorbing layer on the sacrificial layer, and
    the step of forming the upper infrared absorbing structure on the infrared sensing layer comprises forming a first upper infrared absorbing layer and a second upper infrared absorbing layer on the infrared sensing layer,
    wherein the first lower infrared absorbing layer and the first upper infrared absorbing layer have same thickness and are formed from same material, and the second lower infrared absorbing layer and the second upper infrared absorbing layer have same thickness and are formed from same material.

19. The method according to claim 18, wherein the step of forming the lower infrared absorbing structure on the sacrificial layer further comprises forming the first lower infrared absorbing layer on the sacrificial layer, and forming the second lower infrared absorbing layer on the first lower infrared absorbing layer, and
    the step of forming the upper infrared absorbing structure on the infrared sensing layer further comprises forming the second upper infrared absorbing layer on the infrared sensing layer, and forming the first upper infrared absorbing layer on the second upper infrared absorbing layer.

20. The method according to claim 12, further comprising:
    before forming the lower infrared absorbing structure, forming an infrared reflective layer on the substrate.

21. The method according to claim 12, further comprising:
    before removing the sacrificial layer, removing part of the lower infrared absorbing structure and part of the upper infrared absorbing structure to form a resilient arm in the infrared absorbing area.

* * * * *